(12) United States Patent
Murakuki et al.

(10) Patent No.: US 7,110,314 B2
(45) Date of Patent: Sep. 19, 2006

(54) SEMICONDUCTOR MEMORY DEVICE AND METHOD FOR INITIALIZING THE SAME

(75) Inventors: Yasuo Murakuki, Kyoto (JP); Hiroshige Hirano, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 53 days.

(21) Appl. No.: 10/515,433

(22) PCT Filed: Jul. 22, 2003

(86) PCT No.: PCT/JP03/09226

§ 371 (c)(1),
(2), (4) Date: Nov. 23, 2004

(87) PCT Pub. No.: WO2004/012196

PCT Pub. Date: Feb. 5, 2004

(65) Prior Publication Data

US 2005/0181554 A1 Aug. 18, 2005

(30) Foreign Application Priority Data

Jul. 25, 2002 (JP) .............................. 2002-216127

(51) Int. Cl.
*G11C 5/14* (2006.01)

(52) U.S. Cl. ...................... 365/226; 365/227

(58) Field of Classification Search ................ 365/226, 365/227, 229, 189.07
See application file for complete search history.

(56) References Cited

U.S. PATENT DOCUMENTS

| | | | | |
|---|---|---|---|---|
| 5,136,327 A | * | 8/1992 | Ogawa | 396/280 |
| 5,452,253 A | | 9/1995 | Choi | |
| 5,539,692 A | | 7/1996 | Horiguchl et al. | |
| 5,734,604 A | * | 3/1998 | Akamatsu et al. | 365/156 |
| 6,035,357 A | * | 3/2000 | Sakaki | 710/301 |
| 6,108,246 A | | 8/2000 | Shiga et al. | |
| 6,185,712 B1 | | 2/2001 | Kirihata et al. | |
| 6,557,106 B1 | * | 4/2003 | Yuzawa et al. | 713/300 |
| 2002/0006676 A1 | | 1/2002 | Mullarkey et al. | |

FOREIGN PATENT DOCUMENTS

| | | |
|---|---|---|
| EP | 0 500 958 | 9/1992 |
| EP | 0 787 993 | 8/1997 |

* cited by examiner

*Primary Examiner*—Vu A. Le
(74) *Attorney, Agent, or Firm*—McDermott Will & Emery LLP

(57) ABSTRACT

A semiconductor memory device includes memory cell blocks (11) through (14) including a nonvolatile memory cell. The memory cell blocks (11) through (14) include chip-data storing regions (11b) through (14b) for storing chip data containing operation parameters of the semiconductor memory device and pass-flag storing regions (11c) through (14c) for storing pass flags which correspond to the respective chip-data storing regions and show the validity of the stored chip data. The chip-data storing regions store the same chip data.

13 Claims, 7 Drawing Sheets

SEMICONDUCTOR MEMORY DEVICE AND METHOD FOR INITIALIZING THE SAME

TECHNICAL FIELD

The present invention relates to semiconductor memory devices and methods for initializing the same. More particularly, the present invention relates to nonvolatile semiconductor memory devices with capacitors including capacitive films made of ferroelectrics, and methods for initializing the same.

BACKGROUND ART

Recently, nonvolatile memories that do not lose recorded data even when power is turned off, such as electronically erasable programmable read only memories which allow erasure of whole blocks at a time (Flash EEPROMs) and ferroelectric random access memories (FeRAMs), have been applied to more and more semiconductor memory devices.

In a nonvolatile memory and system using the nonvolatile memory, a memory section of the nonvolatile memory stores operation modes thereof and operation modes of the system for the purpose of optimization of the system. If the memory section is configured to perform redundancy replacement, defects occurring in the memory section used by the system, if any, are repaired using addresses for redundancy replacement held in the memory section.

Conventionally, in order to optimize operation modes of a memory section and operation modes of a system or to perform redundancy replacement, chip data containing the operation modes or an address for the redundancy replacement is stored in a region of a nonvolatile memory section beforehand, and the nonvolatile memory section is initialized by reading out the chip data from the region after power has been turned on, thereby initializing the operation modes of the nonvolatile memory section and of the system and setting redundancy replacement, for example.

Hereinafter, a known semiconductor memory device having a nonvolatile memory will be described with reference to the drawing.

FIG. 7 shows a circuit configuration of a known semiconductor memory device.

As shown in FIG. 7, the known semiconductor memory device includes a first memory cell block 101, a second memory cell block 102, a third memory cell block 103 and a fourth memory cell block 104, which are regions for storing user data (usually memory cells) arranged in columns and rows and each of which is made up of a plurality of nonvolatile memory cells.

The first memory cell block 101 is provided with a chip-data storing region 101$b$ for storing chip data including operation modes of the memory cell block and an address for redundancy replacement, for example, as well as a normal memory cell 101$a$.

The memory cell blocks 101 through 104 are connected to a memory control circuit 110, which receives an internal control signal from a command decoder 111 for decoding an external command from a microcomputer 120. The memory control circuit 110 is connected to a system register 112 for temporarily storing the operation modes and the address for redundancy replacement.

In initialization of the semiconductor memory device thus configured, the microcomputer 120 reads out the chip data from the chip-data storing region 101$b$ via the memory control circuit 110 and writes the chip data into the system register 112 after power has been turned on, thereby setting the operation modes of the device and performing redundancy replacement, for example. In this case, to initialize the device normally, the chip-data storing region 101$b$ needs to pass a memory test. If a failure is found at even one address in the chip-data storing region 101$b$, the whole of the semiconductor chip is considered a defective.

As described above, the known semiconductor memory device has a first problem that a failure occurring at an address in the chip-data storing region 101$b$ makes the semiconductor chip considered as a detective even if the memory cell blocks 101 through 104 have no defect.

In addition, the known semiconductor memory device has a second problem that no measure has been taken to date against unstableness of the power source voltage which occurs because the device is initialized immediately after power has been turned on and which therefore requires highly reliable operation as compared to normal operation.

Further, input of the external command during the initialization might cause the setting of the system operation modes and address information for redundancy replacement to be lost. This is serious especially in memories such as FeRAMs that perform destructive read out (a third problem).

DISCLOSURE OF INVENTION

A first object of the present invention is therefore improving the reliability of chip data stored in a semiconductor memory device including a nonvolatile semiconductor memory cell. A second object of the present invention is improving the reliability of initialization of the device.

To achieve the first object, a first inventive semiconductor memory device includes: at least one memory cell block including a nonvolatile memory cell. The at least one memory cell block includes a plurality of chip-data storing regions for storing chip data containing operation parameters of the semiconductor memory device and a plurality of pass-flag storing regions for storing pass flags. The pass-flag storing regions correspond to the respective chip-data storing regions and indicate the validity of the stored chip data. The chip-data storing regions are used to store the same chip data.

In the first semiconductor memory device, all the chip-data storing regions include the same chip data. Accordingly, if a number n (where n is an integer of at least two) of chip-data storing regions are provided, only one effective pass flag is enough to read normal chip data, so that the reliability of the inventive device is n times higher than that of the known semiconductor memory device.

In the first inventive semiconductor memory device, the at least one memory cell block preferably includes a plurality of memory cell blocks, and the chip-data storing regions are preferably provided in the respective memory cell blocks.

For example, if all the chip-data storing regions are provided in one of the memory cell blocks, a word line or a bit line for having access to the chip-data storing regions can be shared. As a result, even defects might be shared. However, since the chip-data storing regions are distributed to the respective memory cell blocks in the inventive device, it is less likely that all the chip-data storing regions include defects at the same time.

In the first inventive semiconductor memory device, each of the pass flags is preferably constituted by a bit string containing a plurality of bits.

Then, if even one of the bits constituting the pass flag is in a "pass" state, it is possible to determine the validity of the pass flag.

In this case, each of the pass flags preferably contains data in which all the bits constituting the bit string are neither "0"s nor "1"s.

Then, even if all the bits are changed into "1" when the bit line and the power source line are short-circuited, failure determination can be made as intended.

In that case, the chip data preferably includes a control bit, and is defined as a control command for giving an instruction of initializing the semiconductor memory device, based on the control bit.

Then, if a control command for giving an instruction of stopping readout, for example, is set in one of the chip-data storing regions, instead of the chip data, it is not necessary to access chip data in the next region. Accordingly, a period for reading the chip data and a period for writing (setting) the data can be reduced.

In such a case, the control command preferably includes either a readout stop command for stopping readout from the chip-data storing regions or a jump command for skipping a readout address.

In the first inventive semiconductor memory device, each of the chip-data storing regions and the pass-flag storing regions in the at least one memory cell block preferably includes a nonvolatile memory cell including two transistors and two capacitors, and a region except for the chip-data storing regions and the pass-flag storing regions in the at least one memory cell block preferably includes a nonvolatile memory cell including a transistor and a capacitor.

As described above, if a FeRAM whose memory cell for storing user data includes a capacitor and a transistor is configured such that each memory cell in a chip-data storing region includes two capacitors and two transistors, the reliability of the chip-data storing region can be enhanced.

In the first inventive semiconductor memory device, the nonvolatile memory cell is preferably a ferroelectric memory cell with a capacitor including a capacitive film made of a ferroelectric, and a period for writing into and rewriting, in read operation, from the chip-data storing regions and the pass-flag storing regions is preferably made longer than a period for writing into and rewriting, in read operation, from a region except for the chip-data storing regions and the pass-flag storing regions in the at least one memory cell block.

In the case of a nonvolatile memory cell which performs destructive readout, if the period for rewrite in a readout cycle is set relatively long as described above, the reliability can be enhanced.

An inventive method is for initializing a semiconductor memory device which includes a memory cell block including a nonvolatile memory cell, the memory cell block includes a plurality of chip-data storing regions for storing chip data containing operation parameters of the semiconductor memory device and a plurality of pass-flag storing regions for storing pass flags. The pass-flag storing regions correspond to the respective chip-data storing regions and show the validity of the stored chip data, and the chip-data storing regions store the same chip data. The inventive method includes the steps of: a) determining whether a pass flag stored in one of the pass-flag storing regions is true or false; b) initializing the semiconductor memory device to decide operation of the semiconductor memory device based on the chip data stored in a chip-data storing region associated with said one of the pass-flag storing regions, if the pass flag is determined to be true in the step a); and c) determining whether pass flag stored in one of the rest of the pass-flag storing regions is true or false, if the pass flag is determined to be false in the step a). The step c) is repeated until the rest of the pass flags is true.

With the inventive method for initializing a semiconductor memory device, if a determined pass flag among the pass flags is false, determination of a pass flag stored in the next pass-flag region is repeated. Accordingly, one effective pass flag out of the pass flags is enough to read normal chip data, thus achieving a high reliability as compared to the known semiconductor memory device.

A second inventive semiconductor memory device achieves the second object of the present invention and includes: a memory cell block including a nonvolatile memory cell; a peripheral circuit for controlling operation of the nonvolatile memory cell; and a power supply voltage detector for detecting a first power supply voltage for resetting the peripheral circuit and a second power supply voltage at which reception of an external command starts, and which is higher than the first power supply voltage.

In the second inventive semiconductor memory device, when the power supply voltage reaches a level at which the second power supply voltage is detected, and then readout of chip data is started simultaneously with turn-off of power, the detection level for the second power supply voltage or the power supply capacitance can be set such that the power supply voltage does not fall below a detection level for the first power supply voltage until the completion of a readout cycle of the chip data. Accordingly, even power is shut off immediately after start of the initializing process, it is possible to prevent the chip data from being destroyed. As a result, the reliability in the initializing process can be enhanced.

In the second inventive semiconductor memory device, the memory cell block includes a chip-data storing region for storing chip data containing an operation parameter of the semiconductor memory device, and the semiconductor memory device includes an initialization circuit for performing initialization in which the chip data is read out in response to the detection of the first power supply voltage performed by the power supply voltage detector, and operation of the semiconductor memory device is decided based on the chip data that has been read out.

In this case, no external command is preferably executed from the readout of the chip data to the decision of operation of the semiconductor memory device.

Then, an external command becomes invalid while determination whether a pass flag is true or false is being performed and chip data is being read out. Accordingly, it is possible to prevent malfunction in the initializing process.

In that case, a signal for disabling readout from and writing into the nonvolatile memory cell is preferably kept on being output from the readout of the chip data to the decision of operation of the semiconductor memory device.

Then, a state of disabled access to a memory cell block under the initializing process can be determined from the outside. As a result, it is possible to prevent malfunction and data destruction.

BRIEF DESCRIPTION OF DRAWINGS

FIG. 2A shows a memory cell included in a normal memory cell region and FIG. 2B shows a memory cell included in a chip-data storing region and a pass-flag storing region.

BEST MODE FOR CARRYING OUT THE INVENTION

An embodiment of the present invention will be described with reference to the drawings.

Figure 1:
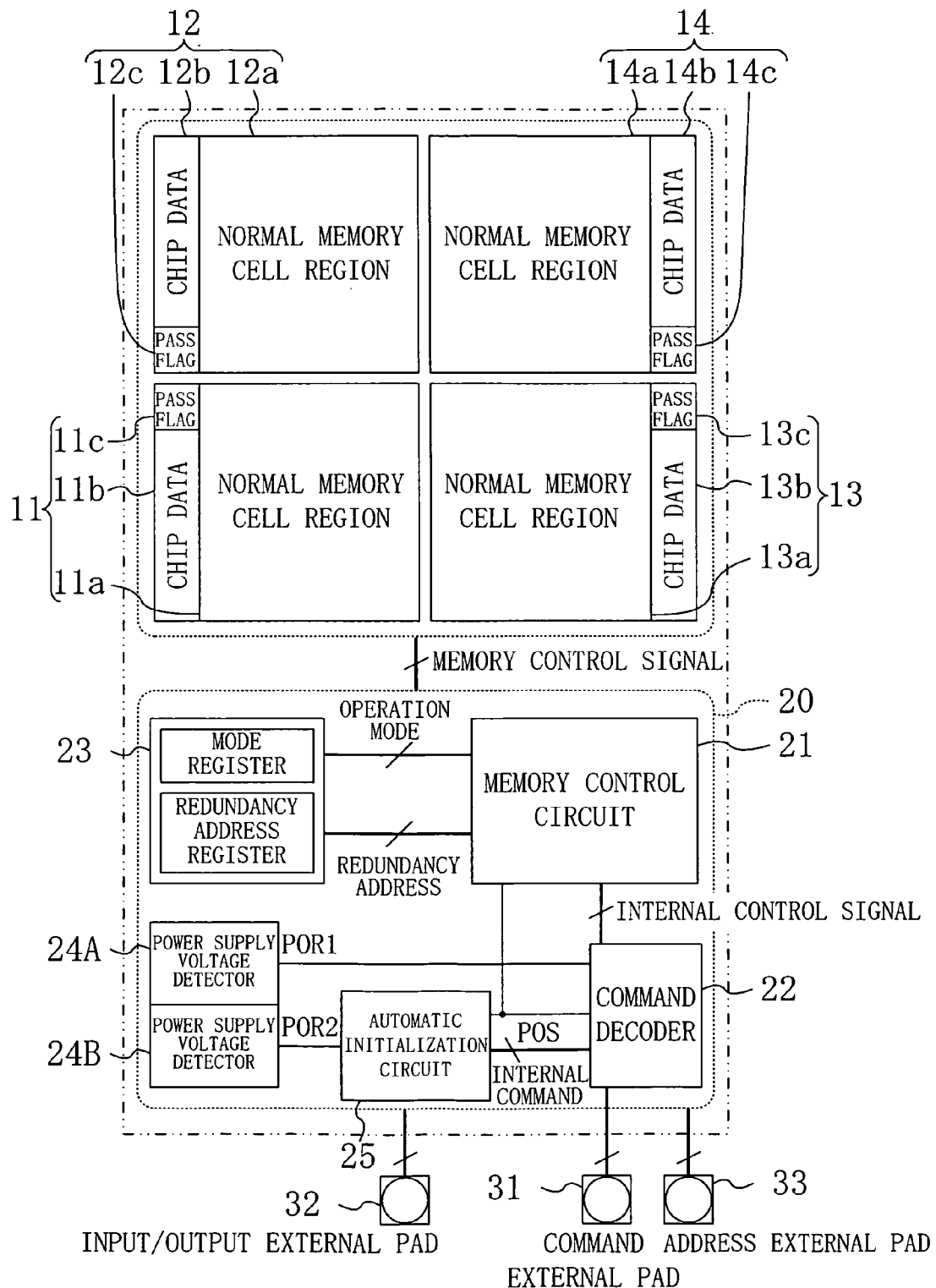
FIG. 1 is a circuit diagram showing a configuration of a semiconductor memory device according to an embodiment of the present invention.

FIG. 1 shows a circuit configuration of a semiconductor memory device according to an embodiment of the present invention, which is a ferroelectric memory (FeRAM) with a capacitor including a capacitive film made of a ferroelectric.

As shown in FIG. 1, the semiconductor memory device of the embodiment includes a first memory cell block 11, a second memory cell block 12, a third memory cell block 13 and a fourth memory cell block 14, which are arranged in columns and rows and each of which is made up of a plurality of nonvolatile memory cells.

The first through fourth memory cell blocks 11 through 14 respectively include: first through fourth normal memory cell regions 11a through 14a storing user data; and first through fourth chip-data storing regions 11b through 14b including, for example, operation modes of respective memory cell blocks, addresses for redundancy replacement and operation modes of a system and storing the same chip data.

The chip-data storing region 11b through 14b also respectively include pass-flag storing regions 11c, 12c, 13c and 14c capable of storing a plurality of pieces of data representing validity (i.e., pass or failure) of the chip data stored.

Now, a peripheral circuit (internal circuit) 20 for the memory cell blocks 11 through 14 is described.

The peripheral circuit 20 includes: a memory control circuit 21; a command decoder 22; a system register 23; a first power supply voltage detector 24A; a second power supply voltage detector 24B; and an automatic initialization circuit 25.

The memory control circuit 21 transmits memory control signals to the respective memory cell blocks 11 through 14.

The command decoder 22 distinguishes an external command input from a command external PAD 31 and an internal command input from the automatic initialization circuit 25 and generates and outputs an internal control signal from the distinguished command.

The memory control circuit 21 reads out or writes data from/into the system register 23 (i.e., the memory control circuit 21 accesses the system register 23), so that the system register 23 temporarily stores operation modes of the respective memory cell blocks 11 through 14 and of the system and addresses for redundancy replacement.

The first power supply voltage detector 24A detects a first power supply voltage Vdet1 during initializing operation and outputs the detection result to the command decoder 22 as a first detection signal POR1.

The second power supply voltage detector 24B detects a second power supply voltage Vdet2 higher than the first power supply voltage Vdet1 and outputs the detection result to the automatic initialization circuit 25 as a second detection signal POR2.

The automatic initialization circuit 25 is made of a state machine and initializes a circuit which needs to be initialized in the peripheral circuit 20, upon receipt of the second detection signal POR2 from the second power supply voltage detector 24B. The automatic initialization circuit 25 also outputs an external command reception disable signal POS to the command decoder 22 and the memory control circuit 22.

The peripheral circuit 20 is connected to an input/output external PAD 32 for receiving input/output signals and to an address external PAD 33 for receiving an address signal.

Figure 2A:
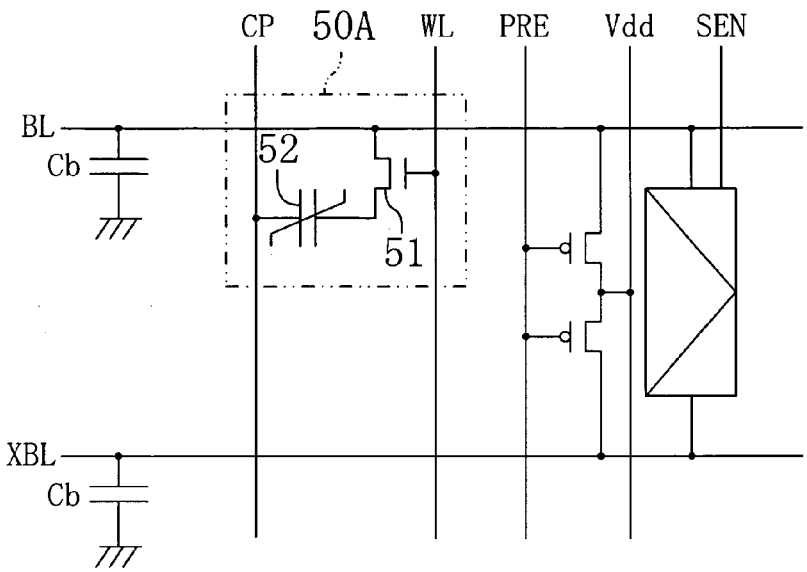
FIGS. 2A and 2B are circuit diagrams showing a memory cell of the semiconductor memory device of the embodiment.

As shown in FIG. 2A, a memory cell 50A included in each of the normal memory cell regions 11a through 14a includes a transistor 51 and a ferroelectric capacitor 52. The transistor 51 has a gate connected to a word line WL, a drain connected to a bit line BL and a source connected to one of the electrodes of the capacitor 52. The other electrode of the capacitor 52 is connected to a cell plate line CP.

Figure 2B:
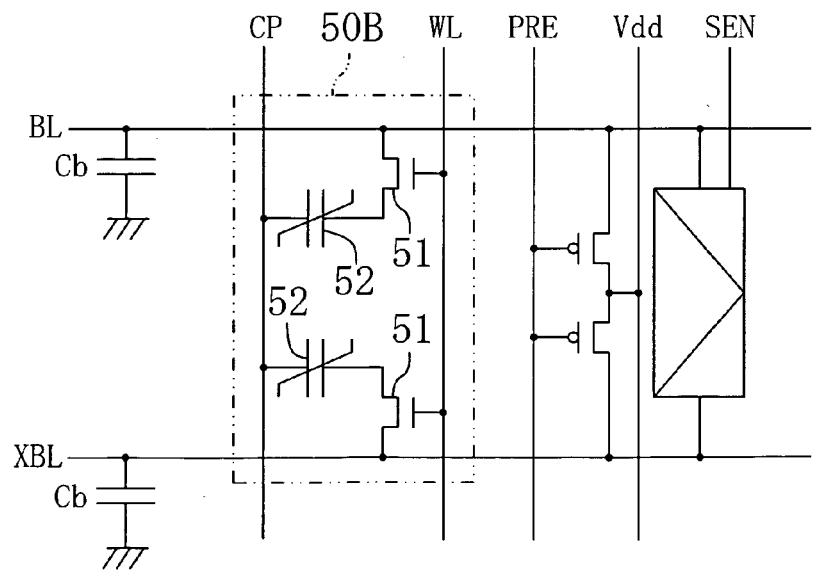

The embodiment is characterized in that a memory cell 50B included in each of the chip-data storing regions 11b through 14b and the pass-flag storing regions 11c through 14c includes two transistors 51 and two ferroelectric capacitors 52, as shown in FIG. 2B.

Now, operation of an automatic initialization circuit including determination whether each pass flag in the FeRAM device thus configured is true or false is described with reference to the drawing.

Figure 3:
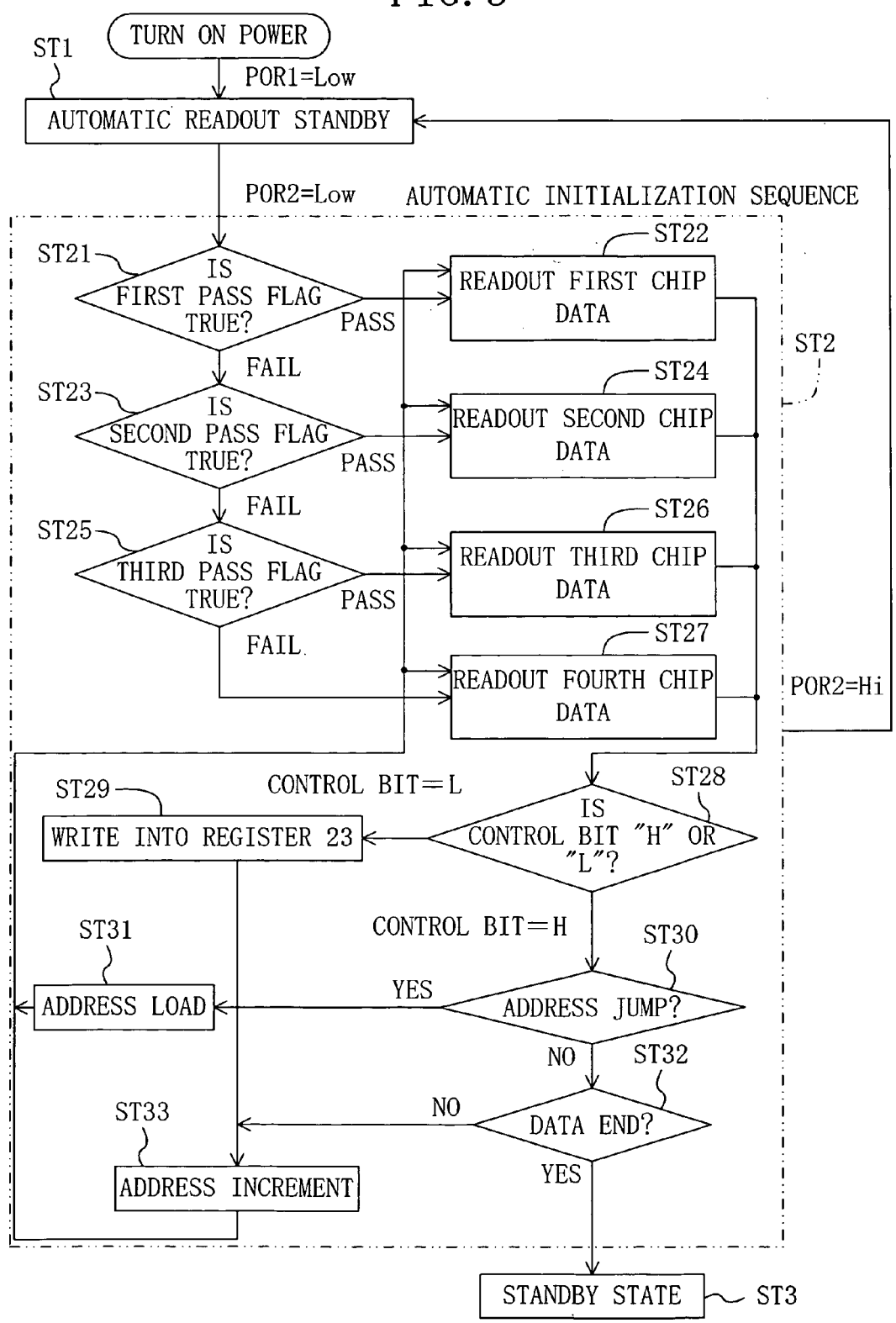
FIG. 3 is a flowchart showing initialization of the semiconductor memory device of the embodiment.

FIG. 3 shows the flow of initialization of the FeRAM device of the embodiment.

In the following description, it is assumed that a PASS flag representing "pass" has been stored in the second pass-flag storing region 12c and a FAIL flag representing "failure" has been stored in each of the first, third and fourth pass-flag storing regions 11c, 13c and 14c after the completion of the memory cell test.

For example, it is assumed that the PASS flag is "10100110", the FAIL flag is "11011001" and each of the flags has an 8-bit configuration in which all the bits are neither "0"s nor "1"s. In such a case, even if all the 8 bits constituting each of the pass flags are changed into "1" when the bit line and the power source line are short-circuited, failure determination can be made as intended. Accordingly, the reliability of the pass flags can be enhanced.

In addition, in order to prevent data of the pass flags from being destroyed, the first pass-flag storing region 11c stores a FAIL flag corresponding to two pieces of data (i.e., two records) and, in the same manner, the second pass-flag storing 12c also stores a PASS flag corresponding to two pieces of data (i.e., two records).

As shown in FIG. 3, firstly, power to the FeRAM device is turned on. Then, as shown in a standby step ST1, the device is in an automatic readout standby mode after the first detection signal POR1 has shifted to a low potential representing that the power supply voltage Vdd reaches the first power supply voltage Vdet1 and before the second detection signal POR2 shifts to a low potential representing that the power supply voltage Vdd reaches to the second power source voltage Vdet2. In this step, the second detection signal POR2 is set at a high potential until the power supply voltage Vdd exceeds the second power supply voltage Vdet2.

Next, in an initialization step ST2, when the second detection signal POR2 shifts to the low potential, the automatic initialization circuit 25 shown in FIG. 1 initializes the peripheral circuit 20. When the initializing process terminates, the FeRAM device goes into a standby mode in a standby step ST3.

The embodiment is characterized in that when the power supply voltage Vdd decreases to the first power supply voltage Vdet1 during the initializing process, the second detection signal POR2 shifts to a high potential, so that the FeRAM device returns into the automatic readout standby mode in the initialization standby step ST1.

Hereinafter, the flow of automatic initialization in the initialization step ST2 will be described.

First, in the first pass-flag determination step ST21, the automatic initialization circuit 25 reads out pass-flag data from the first pass-flag storing region 11c and determines the validity of the pass flag that has been read out. As described above, since the first pass-flag storing region 11c stores the FAIL flag, the pass flag is determined to be false, so that the procedure proceeds to a second pass-flag determination step ST23. Since the pass flag corresponds to two records, the validity of the two records may be determined.

Next, in the second pass-flag determination step ST23, the automatic initialization circuit 25 reads out pass-flag data from the second pass-flag storing region 12c and determines the validity of the pass flag that has been read out. In this step, since the second pass-flag storing region 12c stores the PASS flag, the pass flag is determined to be true, so that the procedure proceeds to a second chip-data readout step ST24. Since the pass flag also corresponds to two records, the validity of the two records may be determined.

Then, in the second chip-data readout step ST24, one or more pieces of chip data are read out from the second chip-data storing region 12b.

Now, an example of chip data is described.

With respect to the chip data, one bit out of, for example, 8-bit configuration is set as a control bit, and the chip data is defined as a control command based on the control bit.

For example, if the control bit is defined as the most significant bit, the chip data and the control command are defined as follows:
chip data="0XXXXXXX"
(where XXXXXXX is a data part and X is either "0" or "1")
control command="1YYYYYYY"
(where YYYYYYY is a command part and Y is either "0" or "1".)

In the case of the control command, $2^7$ different commands can be defined.

In the embodiment, as examples of the control command, a readout stop command and an address jump command are defined as follows:
readout stop command="100YYYYY"
address jump command="101ZZZZZ"
(where ZZZZZ is an address part and Z is either "0" or "1".)

Thereafter, in a control bit determination step ST28, a control bit for chip data is determined. For example, if the control bit is "1" and is determined to be a readout stop command, the procedure directly proceeds to the standby step ST3 so that the FeRAM device goes into a standby mode. Accordingly, even if the number of records for chip data differ among respective chips such as addresses for redundancy replacement, only a predetermined number of pieces of chip data can be read out, thus reducing a period of time required for reading out the chip data and for writing the chip data that has been read out into the register 23 of the system.

Then, if the control bit is "1" and is determined to be an address jump command in an address jump determination step ST30, a specified address within the second chip-data storing region 12b is acquired in an address load step ST31, and the content at the specified address is read out in a second chip-data readout step ST24.

A relative address or an absolute address may be used as a jump address. For example, if the absolute address is to be set, it is sufficient that an address value is loaded to set the absolute value. If the relative address is to be set, a jump address value (i.e., an offset value) is added to a current address value.

In this manner, even if the chip-data storing region 12b partly includes a defect region, the address jump command allows data to be read out from regions other than the defect region, so that the chip-data storing regions can be effectively used.

On the other hand, if the control bit is "0" and is determined to be chip data in the control bit determination step ST28, data that has been read out is written into a mode setting register or a redundancy address register in the system register 23 without change. Thereafter, in an address increment step ST33, a readout address is updated to a next address.

Then, in the second chip-data readout step ST24, chip data is read out from the updated address.

When the data that has been read out is determined to be data representing end of data (EOD) in a data end determination step ST32, or when the readout stop command described above is detected, the initialization of the FeRAM device terminates and the procedure proceeds to the standby step ST3.

During the automatic initialization, the automatic initialization circuit 25 outputs the external command reception disable signal POS to the command decoder 22 so as to disable reception of an external command. In this manner, the external command is not executed during the automatic initialization, thus preventing malfunction in the initializing process.

In addition, as shown in FIG. 2B, the memory cell 50B constituting each of the second chip-data storing region 12b and the second pass-flag storing region 12c has a so-called two-transistor, two-capacitor (2T2C) structure. Therefore, while the external command reception disable signal POS is activated in the automatic initialization, the memory control circuit 21 operates in a control mode for 2T2C. The external command reception disable signal POS is capable of being output to the outside via the input/output external PAD 32, so that a period for readout of chip data is recognized from the outside.

Figure 4:
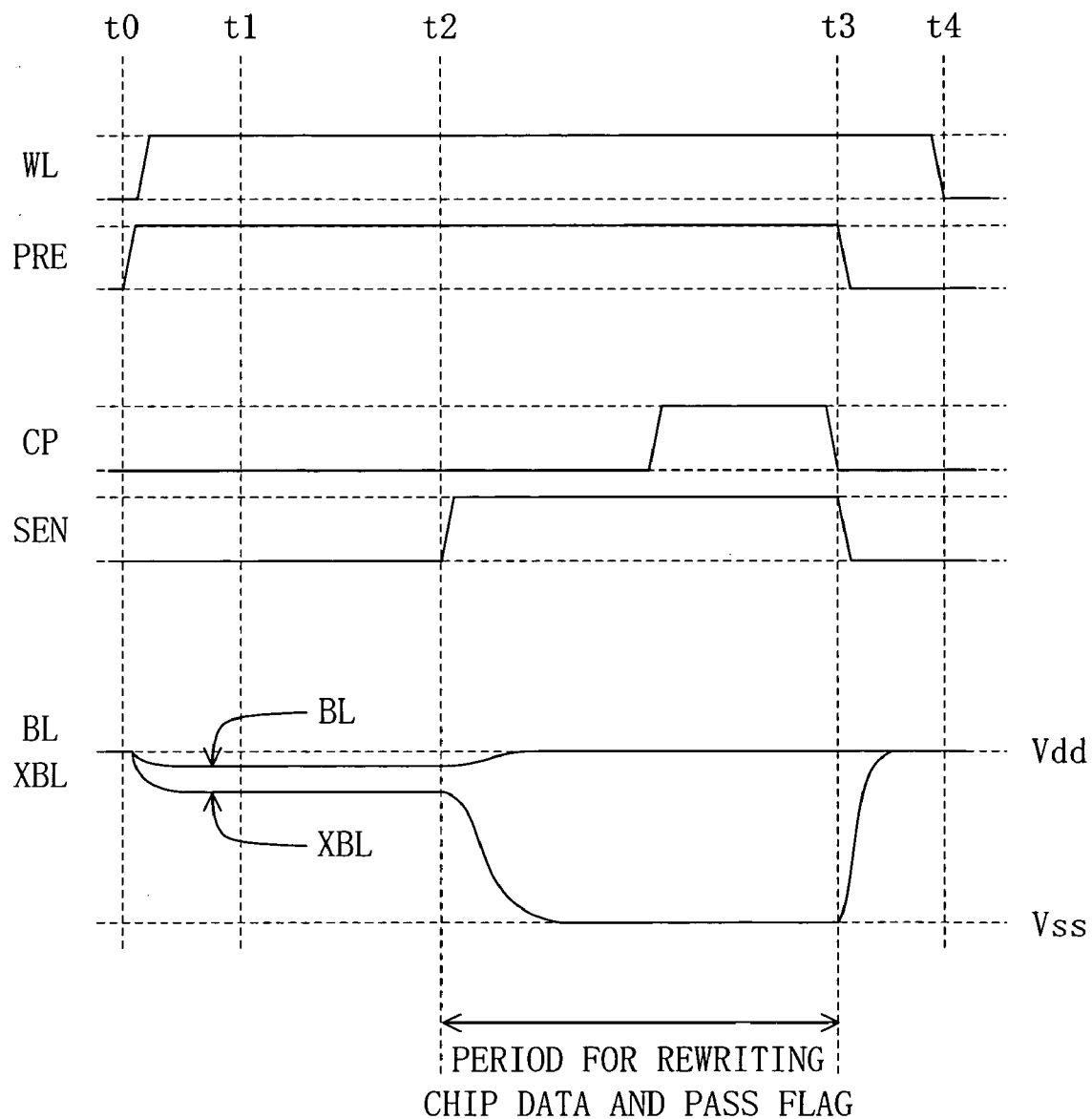
FIG. 4 is a timing chart illustrating rewriting in initializing a memory cell included in a chip-data storing region and a pass-flag storing region in the semiconductor memory device of the embodiment.

Furthermore, as shown in a timing chart of FIG. 4, the embodiment is characterized by adopting a control mode in which a period for rewriting chip data and pass flags into respective memory cells is made longer than a period for rewriting into respective memory cells in the normal memory cell regions 11a through 14a in a cycle of reading the chip data and the pass flags. For comparison, FIG. 5 shows a timing chart of the period for rewriting into the memory cells in a cycle of readout from the normal memory cell regions.

Figure 5:
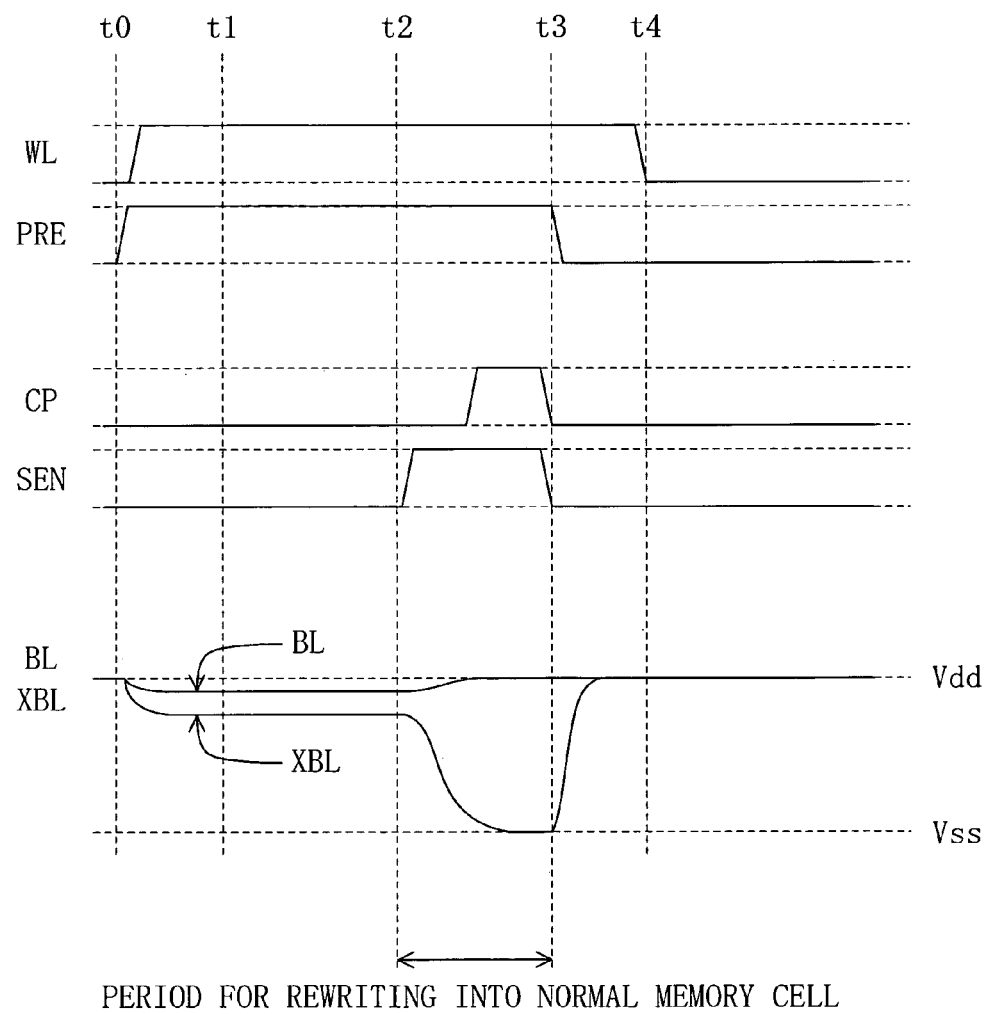
FIG. 5 is a timing chart illustrating rewriting into a memory cell included in a normal memory region in the semiconductor memory device of the embodiment.

As shown in FIGS. 4 and 5, an interval between a timing t2 and the next timing t3, i.e., a period during which a sense amplifier activation signal SEN and the cell plate line CP are active, is made longer than that in the case of the memory cells in the normal memory cell regions, so that data is sufficiently written into 2T2C memory cells into which data is rewritten in the readout cycle. Accordingly, reliability of chip data and pass flags is greatly enhanced.

Although not shown, in writing operation of chip data and pass flags, a period for the writing is made longer than that in the case of the memory cells in the normal memory cell regions.

Hereinafter, it will be described how the first and second power supply voltage detectors 24A and 24B of the FeRAM device of the embodiment operate, with reference to the drawing.

Figure 6:
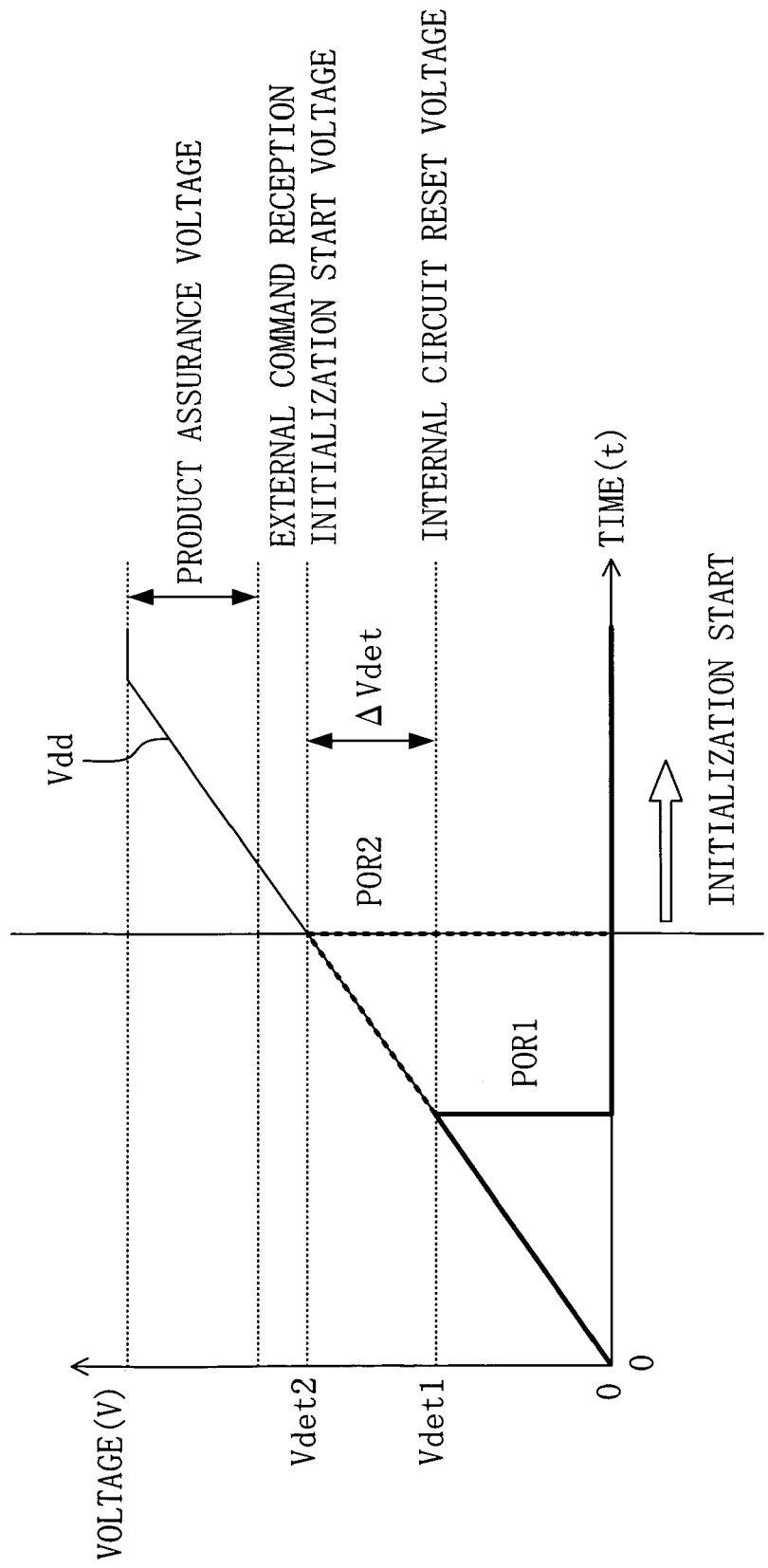
FIG. 6 is a graph showing a relationship between a power supply voltage and timings of activating first and second detection signals after power has been turned on in the semiconductor memory device of the embodiment.
Figure 7:
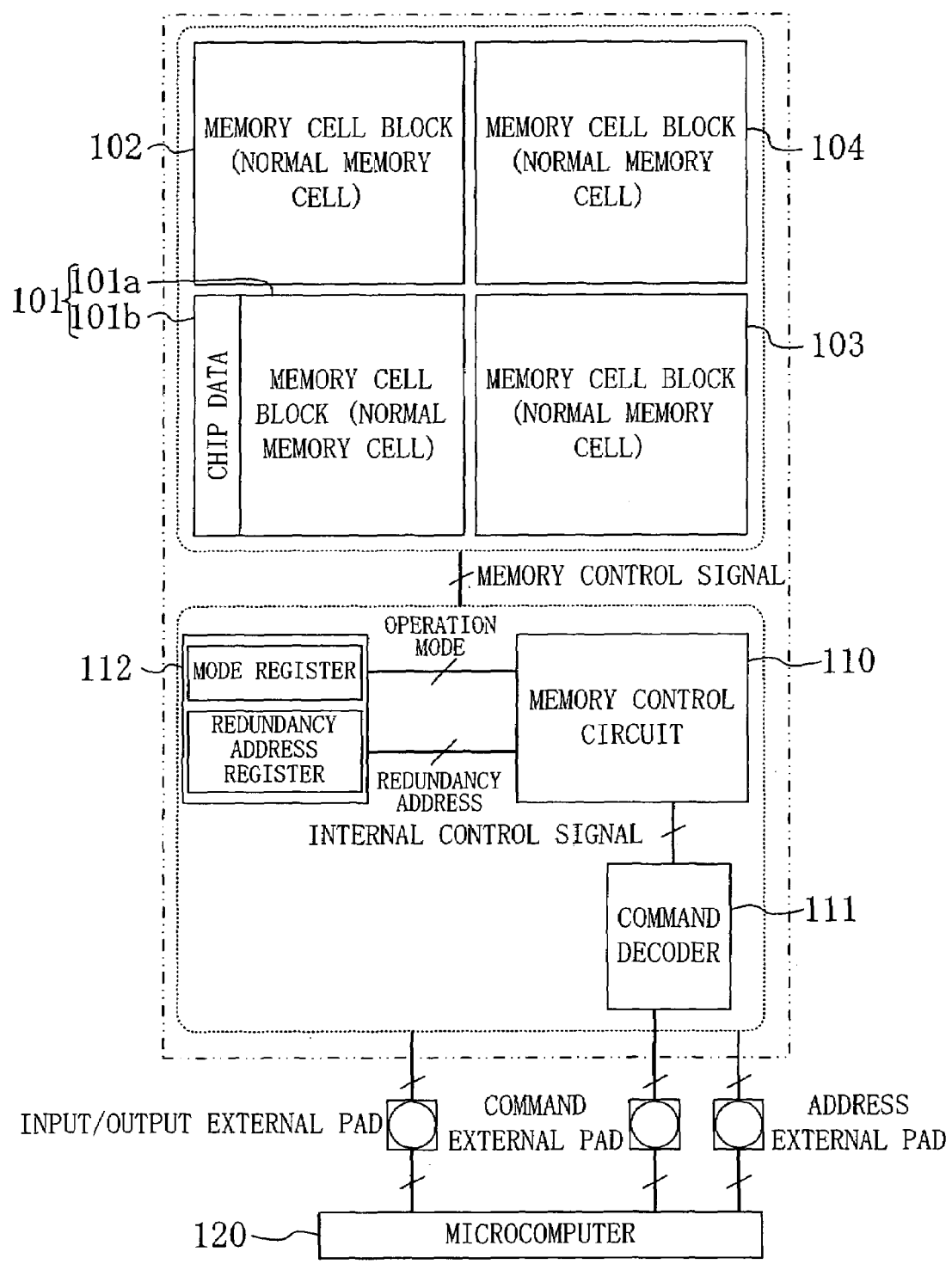
FIG. 7 is a circuit diagram showing a configuration of a known semiconductor memory device.

FIG. 6 shows a relationship between the power supply voltage Vdd and timings of activating the first and second detection signals POR1 and POR2 after power has been turned on. In FIG. 6, the abscissa represents time, while the ordinate represents the power supply voltage Vdd.

In general, initialization performed immediately after turn-on of power needs to be performed in consideration of the case where power supply might be shut off during the initializing process.

In view of this, in the embodiment, the first power supply voltage detector 24A for detecting the first power supply voltage Vdet1 and the second power supply voltage detector 24B for detecting the second power supply voltage Vdet2 higher than the first power supply voltage Vdet1 are provided in order to prevent destruction of chip data which is being read out even when power supply is shut off during the initializing process.

As shown in FIG. 6, when power is turned on, the power supply voltage Vdd increases gradually with time. When the first power supply voltage detector 24A detects that the power supply voltage Vdd reaches the first detection voltage Vdet1, the first power supply voltage detector 24A shifts the first detection signal POR1 being output to the command decoder 22 from a high potential (=the voltage Vdet1) to a low potential. In this case, when the power source voltage Vdd is lower than the first detection voltage Vdet1, the command decoder 22 outputs a reset signal to the peripheral circuit (internal circuit) 20 which needs to be reset, in response to the first detection signal POR1 at the high potential. Then, when the power supply voltage Vdd exceeds the first detection voltage Vdet1, the reset signal is canceled in response to the first detection signal POR1 at the low potential.

Thereafter, the second power supply voltage detector 24B detects that the power supply voltage Vdd increases to reach the second detection voltage Vdet2, the second power supply voltage detector 24B shifts the second detection signal POR2 being output to the automatic initialization circuit 25 from a high potential (=the voltage Vdet2) to a low potential.

The second detection voltage Vdet2 is a voltage for allowing reception of an external command. When the power supply voltage Vdd increases to a voltage equal to or higher than the second detection voltage Vdet2, the command decoder 22 receives the external command to initiate operation of the FeRAM device.

The embodiment has a configuration in which the initializing process does not start until the power supply voltage Vdd reaches the second detection voltage Vdet2, and the automatic initialization circuit 25 starts initialization when detecting a falling edge of the second detection signal POR2. More specifically, the automatic initialization circuit 25 outputs a given internal command to the command decoder 22. When receiving the internal command, the command decoder 22 gives an instruction of reading chip data and writing the chip data that has been read out into the system register 23 (the mode register and the redundancy address register).

In this case, it is significant to have a configuration in which when the second detection signal POR2 shifts to the active low potential, reception of the following external commands is disabled.

In addition, destruction of chip data under automatic initialization can be prevented, and $\Delta$Vdet which is a difference between the second detection voltage Vdet2 and the first detection voltage Vdet1 is described below. $\Delta$Vdet is defined by Equation (1):

$$\Delta Vdet > Icc \times t_{Cyc}/C \quad (1)$$

(where Icc is current consumption in a cycle of reading chip data, $t_{Cyc}$ is a cycle time for reading chip data and C is power supply capacitance)

The right-hand side of Equation (1) indicates the amount of voltage drop. If the left-hand $\Delta$Vdet is set greater than the right-hand voltage drop amount, readout of chip data terminates before the internal circuit is reset even if power supply is shut off, thus ensuring prevention of destruction of the chip data that has been read out during automatic initialization.

In the embodiment, the first and second power supply voltage detectors 24A and 24B are not necessarily separate from each other.

In the embodiment, the chip-data storing regions 11b through 14b and the pass-flag storing regions 11c through 14c are provided corresponding to the respective four memory cell blocks 11 through 14. However, the chip-data storing regions and the pass-flag storing regions are not necessarily provided corresponding to the respective memory cell blocks.

Alternatively, a plurality of chip-data storing regions and a plurality of pass-flag storing regions may be provided in a single memory cell block. In this case, however, a bit line or a word line can be shared. Therefore, the arrangement of the embodiment in which these regions are distributed to the respective memory cell blocks is preferable.

In the embodiment, the FeRAM device is used as a nonvolatile semiconductor memory device. However, the present invention is not limited to this specific embodiment. The present invention is applicable to FLASH memories, nonvolatile memories such as EEPROMs or magnetic random access memories (MRAMs) and systems using these memories.

The definition of the chip data and the control command in the embodiment is an example. The present invention is, of course, not limited to the embodiment.

The invention claimed is:

1. A semiconductor memory device comprising:
   at least one memory cell block including a nonvolatile memory cell,
   wherein the at least one memory cell block includes a plurality of chip-data storing regions for storing chip data containing operation parameters of the semiconductor memory device and a plurality of pass-flag storing regions for storing pass flags, the pass-flag storing regions correspond to the respective chip-data storing regions and indicate the validity of the stored chip data, and
   the chip-data storing regions are used to store the same chip data.

2. The device of claim 1, wherein the at least one memory cell block comprises a plurality of memory cell blocks, and the chip-data storing regions are provided in the respective memory cell blocks.

3. The device of claim 1, wherein each of the pass flags is constituted by a bit string containing a plurality of bits.

4. The device of claim 3, wherein each of the pass flags contains data in which all the bits constituting the bit string are neither "0"s nor "1"s.

5. The device of claim 3, wherein the chip data comprises a control bit, and is defined as a control command for giving an instruction of initializing the semiconductor memory device, based on the control bit.

6. The device of claim 5, wherein the control command includes either a readout stop command for stopping readout from the chip-data storing regions or a jump command for skipping a readout address.

7. The device of claim 1, wherein each of the chip-data storing regions and the pass-flag storing regions in the at least one memory cell block includes a nonvolatile memory cell including two transistors and two capacitors, and
a region except for the chip-data storing regions and the pass-flag storing regions in the at least one memory cell block includes a nonvolatile memory cell including a transistor and a capacitor.

8. The device of claim 1, wherein the nonvolatile memory cell is a ferroelectric memory cell with a capacitor including a capacitive film made of a ferroelectric, and
a period for writing into and rewriting, in read operation, from the chip-data storing regions and the pass-flag storing regions is made longer than a period for writing into and rewriting, in read operation, from a region except for the chip-data storing regions and the pass-flag storing regions in the at least one memory cell block.

9. A method for initializing a semiconductor memory device which includes a memory cell block including a nonvolatile memory cell, the memory cell block including a plurality of chip-data storing regions for storing chip data containing operation parameters of the semiconductor memory device and a plurality of pass-flag storing regions for storing pass flags, the pass-flag storing regions corresponding to the respective chip-data storing regions and showing the validity of the stored chip data, the chip-data storing regions storing the same chip data,
the method comprising the steps of:
a) determining whether a pass flag stored in one of the pass-flag storing regions is true or false;
b) initializing the semiconductor memory device to decide operation of the semiconductor memory device based on the chip data stored in a chip-data storing region associated with said one of the pass-flag storing regions, if the pass flag is determined to be true in the step a); and
c) determining whether a pass flag stored in one of the rest of the pass-flag storing regions is true or false, if the pass flag is determined to be false in the step a),
wherein the step c) is repeated until the rest of the pass flags is true.

10. A semiconductor memory device, comprising:
a memory cell block including a nonvolatile memory cell;
a peripheral circuit for controlling operation of the nonvolatile memory cell; and
a power supply voltage detector for detecting a first power supply voltage for resetting the peripheral circuit and a second power supply voltage at which reception of an external command starts, and which is higher than the first power supply voltage,
wherein the power suppply voltage detector also detects whether the first power supply voltage is detected prior to the second power supply voltage.

11. A semicondutor memory device, comprising:
a memory cell block including a nonvolatile memory cell;
a peripheral circuit for controlling operation of the nonvolatile memory cell; and
a power supply voltage detector for detecting a first power supply voltage for resetting the peripheral circuit and a second power supply voltage at which reception of an external command starts, and which is higher than the first power supply voltage,
wherein the memory cell block includes a chip-data storing region for storing chip data containing an operation parameter of the semiconductor memory device, and
the semiconductor memory device includes an initialization circuit for performing initialization in which the chip data is read out in response to the detection of the first power supply voltage performed by the power supply voltage detector, and operation of the semiconductor memory device is decided based on the chip data that has been read out.

12. The device of claim 11, wherein no external command is executed from the readout of the chip data to the decision of operation of the semiconductor memory device.

13. The device of claim 11, wherein a signal for disabling readout from and writing into the nonvolatile memory cell is kept on being output from the readout of the chip data to the decision of operation of the semiconductor memory device.

* * * * *